United States Patent
Katano et al.

(10) Patent No.: US 7,940,203 B2
(45) Date of Patent: May 10, 2011

(54) ELECTROMAGNETIC WAVE ABSORPTION BOARD TO BE USED IN WIRELESS LAN

(75) Inventors: Masaaki Katano, Matsusaka (JP);
Tadashi Onishi, Matsusaka (JP);
Yoshinori Shirai, Matsusaka (JP);
Tetsuji Hattori, Matsusaka (JP)

(73) Assignee: Central Glass Company, Limited, Ube-shi (JP)

( * ) Notice: Subject to any disclaimer, the term of this patent is extended or adjusted under 35 U.S.C. 154(b) by 0 days.

(21) Appl. No.: 12/298,129

(22) PCT Filed: Apr. 27, 2007

(86) PCT No.: PCT/JP2007/059165
§ 371 (c)(1),
(2), (4) Date: Oct. 22, 2008

(87) PCT Pub. No.: WO2007/129607
PCT Pub. Date: Nov. 15, 2007

(65) Prior Publication Data
US 2009/0096659 A1    Apr. 16, 2009

(30) Foreign Application Priority Data

May 2, 2006  (JP) ................................ 2006-128631
May 2, 2006  (JP) ................................ 2006-128632
Apr. 2, 2007  (JP) ................................ 2007-096610

(51) Int. Cl.
*H01Q 17/00*  (2006.01)
*H05K 9/00*  (2006.01)
*G01S 13/00*  (2006.01)

(52) U.S. Cl. .................... 342/4; 342/1; 174/32; 174/350
(58) Field of Classification Search .................. 342/1–4, 342/175; 174/32–36, 350–397; 244/129.1, 244/129.3, 129.4
See application file for complete search history.

(56) References Cited

U.S. PATENT DOCUMENTS 3,540,047 A  *  11/1970  Hach et al. ........................ 342/1
(Continued)

FOREIGN PATENT DOCUMENTS
JP    3-83996 U    8/1991
(Continued)

OTHER PUBLICATIONS

International Search Report dated Jun. 19, 2007 including English translation of the relevant portion (Six (6) pages).

*Primary Examiner* — Bernarr E Gregory
(74) *Attorney, Agent, or Firm* — Crowell & Moring LLP

(57) ABSTRACT

In a double glazing where a pair of transparent glass sheets are arranged at an interval by having a spacer at the circumferential end portion and where a hollow layer sealed between the pair of glass sheets is formed, there is provided an electromagnetic absorption board used for wireless LAN, which is characterized in that the thickness of the glass sheet is in a range of 2.5-20 mm, that the thickness of the hollow layer is in a range of 2.5-15 mm, that at least one glass sheet of the pair of glass sheets is formed with a resistive film having a surface resistance (surface resistivity) in a range of 20Ω/□ to 2 kΩ/□, and that the resistive film is formed on a glass sheet side on the hollow layer side.

2 Claims, 10 Drawing Sheets

U.S. PATENT DOCUMENTS

| | | | | |
|---|---|---|---|---|
| 4,038,660 A | * | 7/1977 | Connolly et al. | 342/1 |
| 4,162,496 A | * | 7/1979 | Downen et al. | 342/4 |
| 4,721,636 A | * | 1/1988 | Hood et al. | 174/389 |
| 5,077,556 A | * | 12/1991 | Aisslinger | 342/3 |
| 5,169,713 A | * | 12/1992 | Kumurdjian | 342/1 |
| 5,381,149 A | * | 1/1995 | Dougherty et al. | 342/1 |
| 5,488,371 A | * | 1/1996 | Targove | 342/1 |
| 5,537,116 A | * | 7/1996 | Ishino et al. | 342/1 |
| 5,855,988 A | * | 1/1999 | Matsuo | 342/1 |
| 6,195,034 B1 | | 2/2001 | Tsuno et al. | |
| 6,504,501 B2 | | 1/2003 | Togashi et al. | |
| 6,700,525 B2 | * | 3/2004 | Gustafsson | 342/1 |
| 7,350,753 B2 | * | 4/2008 | Guidon et al. | 244/129.3 |
| 7,471,233 B2 | * | 12/2008 | Kurihara et al. | 342/4 |

FOREIGN PATENT DOCUMENTS

| | | |
|---|---|---|
| JP | 5-37178 A | 2/1993 |
| JP | 10-275997 A | 10/1998 |
| JP | 2001-44750 A | 2/2001 |
| JP | 2003-8279 A | 1/2003 |
| JP | 2005-188059 A | 7/2005 |

* cited by examiner

ELECTROMAGNETIC WAVE

INCIDENCE SIDE FREE SPACE

TRANSMISSION SIDE FREE SPACE

ELECTROMAGNETIC WAVE

INCIDENCE SIDE FREE SPACE

TRANSMISSION SIDE FREE SPACE

ELECTROMAGNETIC WAVE ABSORPTION BOARD TO BE USED IN WIRELESS LAN

TECHNICAL FIELD

The present invention relates to an electromagnetic wave absorption board used for a transparent wireless LAN, which is used mainly for openings of external walls of buildings or indoor partitions, etc.

BACKGROUND OF THE INVENTION

In recent years, various information transmissions have become possible along with a dramatic progress of information transmission technology. In particular, wireless information transmission is greatly superior and actively used from the viewpoint of convenience.

As means of wireless information transmission, cellular phone, PDA (personal digital assistance), wireless LAN, broadcasting waves, automotive radar, ETC on-vehicle equipment, various electronic devices, etc. can be cited.

On the other hand, as these wireless information transmissions spread, electromagnetic waves emitted from devices used for wireless information transmission intrude into building insides through openings of buildings to become electromagnetic noises. Therefore, there is a demand for an electromagnetic wave absorption board that can effectively absorb electromagnetic waves and has transparency.

Of wireless information transmissions, wireless LAN (local area network) is not required to have LAN works (such as cord wiring work) in the interior. Therefore, it greatly contributes to the cost reduction and ease of use in offices and general homes.

However, wireless LAN generates many problems, such as lowering of LAN speed due to the influence of reflective members (desk, locker, chair, etc.) in the interior, eavesdropping due to outdoor radio wave leak, radio wave interference among buildings and constructions (due to four channels in 2.45 GHz band region), and unauthorized access and impersonation from outside.

As countermeasures against such problems, countermeasures are conducted by exchange of issuer certificates between communication terminals, such as PC (personal computer), and servers, data encryption or periodic automatic change of cryptography key, issues of ID and passwords, etc.

However, there is no model compatibility for conducting exchange of issuer certificates, and it is difficult among different models. Countermeasures, such as data encryption, periodic automatic change of cryptography key, and ID and passwords, are accompanied with a risk of decipherment by a third person.

Therefore, they say it is necessary to prevent information leaks outside by disposing a transparent electromagnetic wave absorption board at an interior partition or an opening of buildings, constructions, etc.

Furthermore, in recent years, from the viewpoint of energy saving, there are many cases of using a double glazing, which is superior in heat insulation, at an opening. As an electromagnetic wave absorption board of such a double glazing structure, Patent Publication 1 discloses a λ/4 type electromagnetic wave absorption body in which an absorption member that is made to absorb incoming electromagnetic waves and a reflection member that is made to reflect incoming electromagnetic waves are disposed to be away from each other at a distance equivalent to ¼ of wavelength of an electromagnetic wave to be absorbed.

In the case of using a λ/4 type electromagnetic wave absorption body, the thickness of the absorption body is required to have a size of ¼ of the wavelength. Therefore, in case that the center frequency used in wireless LAN is 2.45 GHz, a thickness of about 31 mm is necessary. Therefore, there is a problem in which the thickness is too much to attach this absorption body to a partition or a window, wall, etc. of constructions.

In Patent Publication 2, there is also a proposal in which, in order to make the thickness of a λ/4 type electromagnetic wave absorption body thin, a conductive film formed in the stripe or grid form is disposed between an absorption member and a reflection member of this λ/4 type electromagnetic wave absorption body, thereby achieving the increase of the effective dielectric constant between the absorption member and the reflection member and the decrease of the thickness.

In the electromagnetic wave absorption body disclosed in Patent Publication 2, it is possible to decrease the board thickness by disposing a conductive film formed in the stripe or grid form between the absorption member and the reflection member of the λ/4 type electromagnetic wave absorption body. It is, however, complicated in its structure itself, and the preparation becomes cumbersome.

In Patent Publication 3, there are proposed one in which an electromagnetic absorption layer is disposed on the exterior side on which electromagnetic waves are incident and in which an electromagnetic reflection layer is disposed on the interior side, and furthermore one in which a liquid having a high dielectric constant is sealed in place of the hollow layer.

In this electromagnetic wave absorption glass disclosed in Patent Publication 3, it is necessary to have a conduction of the electromagnetic reflection layer with the frame. Furthermore, heat insulation becomes inferior by using a liquid having a high dielectric constant in place of the hollow layer.

Furthermore, in a single layer type, transparent, electromagnetic wave absorption body equipped with a dielectric layer and an impedance layer, a technique is disclosed in Patent Publication 4 in which an electromagnetic wave absorption effect is obtained by using a phase difference between electromagnetic waves reflected on the surface of the impedance layer and electromagnetic waves reflected on the surface of the dielectric layer. However, in case that absorption of unnecessary electromagnetic waves generated from the interior side is necessary, it is necessary to direct the conductive film surface to the exterior side. Therefore, there is a risk of deterioration in durability of the conductive film.

Patent Publication 1: Japanese Patent Application Publication 2001-44750

Patent Publication 2: Japanese Patent Application Publication 10-275997

Patent Publication 3: Japanese Patent Application Publication 5-37178

Patent Publication 4: Japanese Patent Application Publication 2003-8279

SUMMARY OF THE INVENTION

The present invention was made in view of the conditions such as Patent Publications 1-4. It provides a transparent, electromagnetic wave absorption board that has a superior heat insulation and a double glazing structure, relative to electromagnetic waves having a frequency in a range of 2.45 GHz and 5.2 GHz, which are used in wireless LAN.

In a double glazing where a pair of transparent glass sheets are arranged at an interval by having a spacer at the circumferential end portion and where a hollow layer sealed between the pair of glass sheets is formed, an electromagnetic wave absorption board of the present invention is an electromagnetic absorption board used for wireless LAN, which is characterized in that the thickness of the glass sheet is in a range of 2-20 mm, that the thickness of the hollow layer is in a range of 5-15 mm, that at least one glass sheet of the pair of glass sheets is formed with a resistive film having a surface resistance (surface resistivity) in a range of 20Ω/□ to 2 kΩ/□, and that the resistive film is formed on a surface of the glass sheet on the side of the hollow layer.

DETAILED DESCRIPTION

An electromagnetic wave absorption board of a double glazing structure of the present invention provides a transparent, electromagnetic wave absorption board that effectively functions in a frequency range of 1-10 GHz by a simple double glazing structure, particularly an electromagnetic wave absorption board that is effective to frequencies of 2.45 GHz and 5.2 GHz of wireless LAN.

Regarding electromagnetic wave absorption capacity, for example, as wireless LAN frequency band region, a frequency band region centering on 2.45 GHz and 5.2 GHz is used. The former is used very often since particularly a transmission from the interior to the exterior is possible. The latter is limited to only interior use due to the regulation of Radio Law. Furthermore, amplification of output is conducted by setting up "access point" upon conducting wireless LAN. Furthermore, interference of electromagnetic waves with other sites is prevented. Since output of "access point" upon this is 22 mW (0.022 W), it is necessary to deal with this output. As compared with general communication devices (cellular phone, etc.), this output is small. Therefore, it can be used as an electromagnetic wave absorption body by setting the electromagnetic wave absorption capacity to 10 dB (attenuation of electromagnetic wave energy to $1/10$) or greater.

In case that PHS phone, personal computer (PC), etc. are used for local wireless LAN, etc. and it is intended to prevent malfunction and eavesdropping of PC and server relative to the wireless communication, a frequency range, in which electromagnetic wave absorption is necessary, is 1-10 GHz.

The frequency, at which an electromagnetic wave absorption board of the present invention becomes effective, is about 1-10 GHz. In this frequency range, there are 800 MHz-1 GHz and 1.5 GHz band of cellular phone, 1.9 GHz band of PHS phone, 2.45 GHz band of PDA (personal digital assistance), 2.45 GHz band and 5.2 GHz band used for PC wireless LAN, ETC on-vehicle equipment 5.8 GHz, etc.

In particular, an electromagnetic wave absorption board of the present invention effectively acts against electromagnetic waves of 2.45 GHz band and 5.2 GHz band, which are used for wireless LAN. It is desirable to use that for preventing the electromagnetic wave propagation to the outside of buildings and for preventing crossing by electromagnetic waves proceeding from the outside of buildings by using that for an opening of outer walls of buildings and the like.

Figure 1:
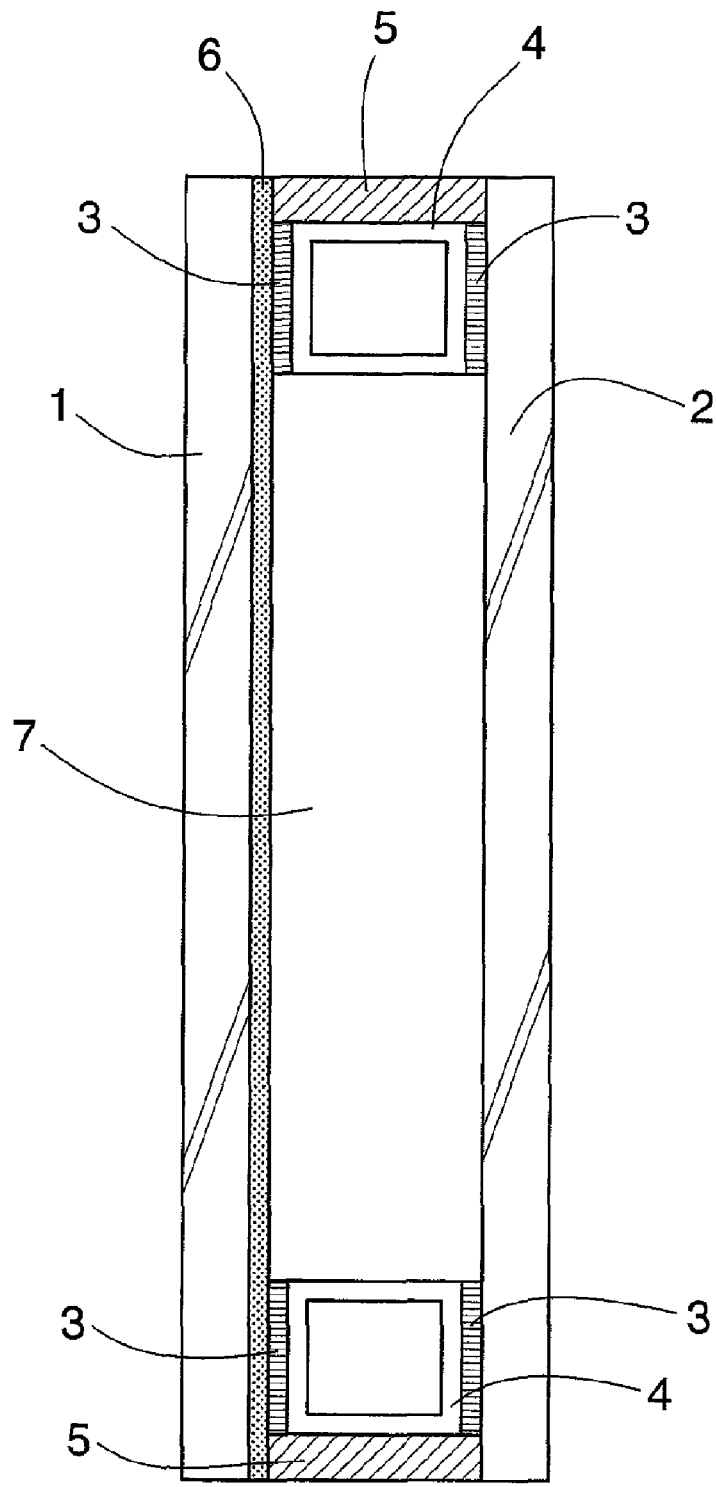
FIG. 1 is a sectional view of an electromagnetic wave absorption board in which a resistive film is formed on a dielectric board.
Figure 2:
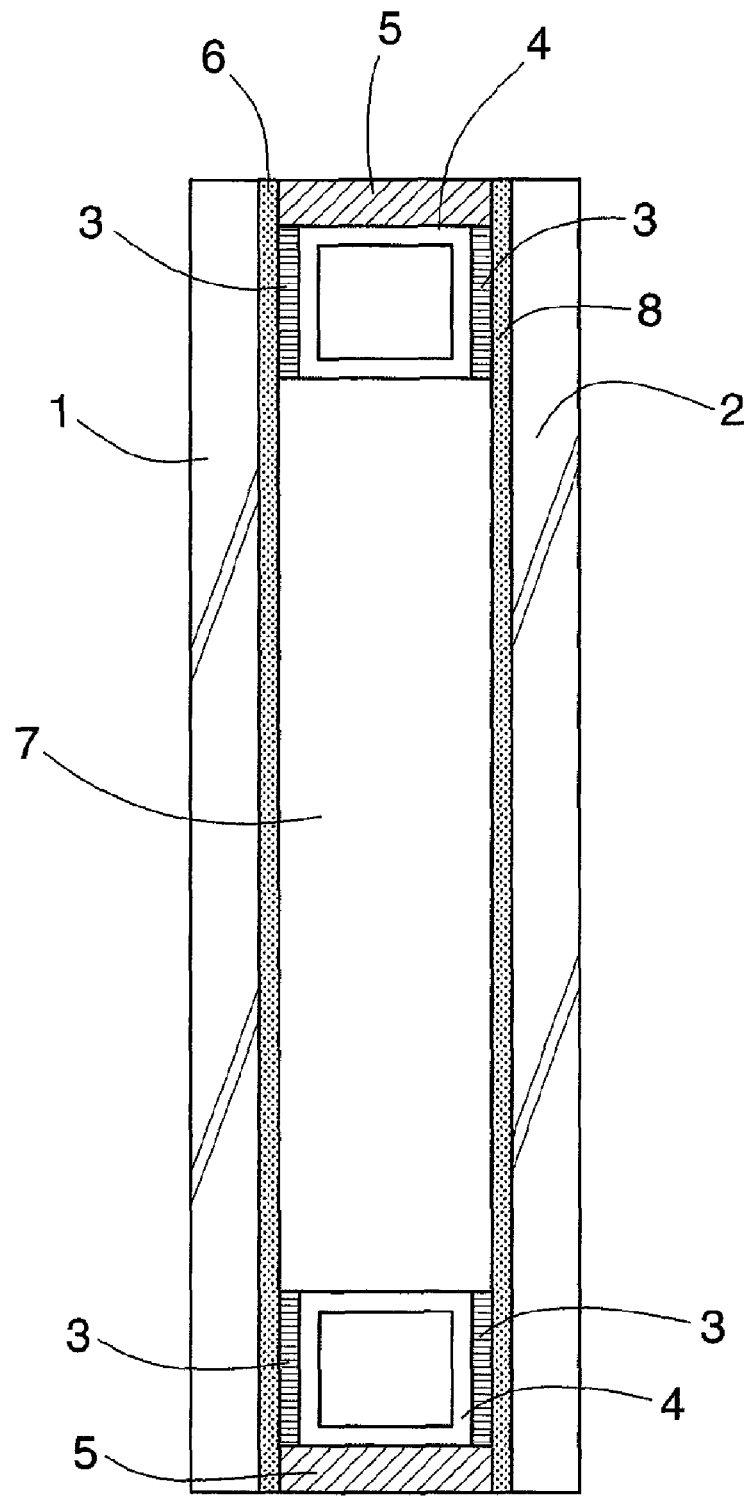
FIG. 2 is a sectional view of an electromagnetic wave absorption board in which resistive films are formed on both of two dielectric boards.

As shown in FIG. 1 and FIG. 2, an electromagnetic wave absorption board of the present invention has a structure of double glazing, in which transparent dielectric boards 1 and 2 are opposingly disposed to have an almost constant distance by using a spacer 4 at a peripheral portion of the dielectric boards. It is preferable that the dielectric boards 1 and 2 and the spacer 4 are bonded together by an adhesive 3 and that a space around the edge of the dielectric boards formed by the spacer 4 and the dielectric boards 1 and 2 is sealed with a sealing member 5. It is preferable to use a butyl rubber series adhesive as the adhesive 3 and to use a silicone series resin, hot-melt series resin, or the like as the sealing member 5.

In the case of opposingly disposing the dielectric boards 1 and 2, it is optional to opposingly dispose them by only an elastic sealing member without using the spacer 4.

Although it is preferable that the hollow layer 7 formed by the dielectric boards 1 and 2 is filled with air, it may be filled with an inert gas such as argon gas.

One in which a resistive film 6 having transparency has been formed on the surface facing the hollow layer 7 of the dielectric board 1 is used.

As dielectric boards 1 and 2, it is possible to use glass sheets such as soda-lime series glass, aluminosilicate series glass and borosilicate series glass, and various plastic boards such as polycarbonate board and acrylic board.

Figure 3:
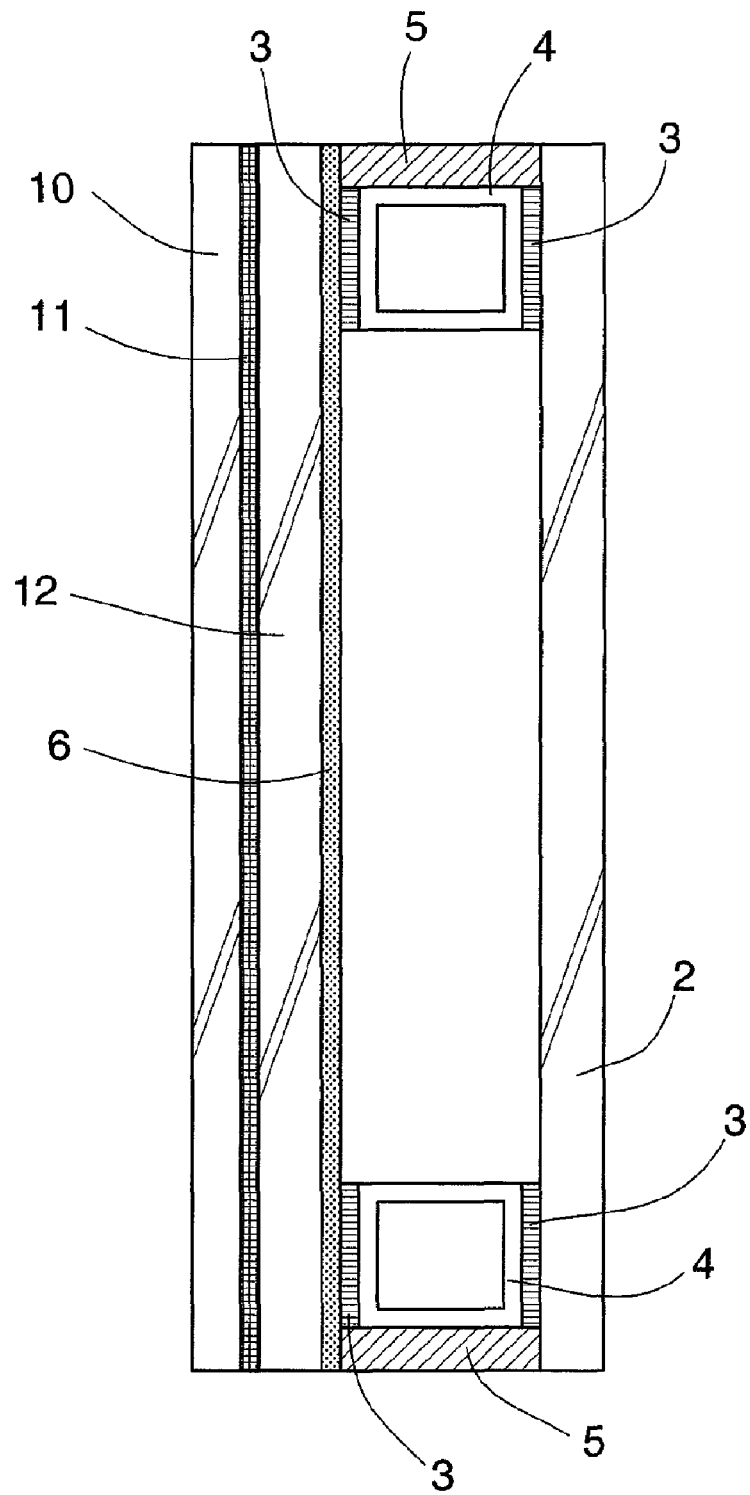
FIG. 3 is a sectional view of an electromagnetic wave absorption board in which two dielectric boards, on which a resistive film is formed, are stacked with an interlayer film.
Figure 4:
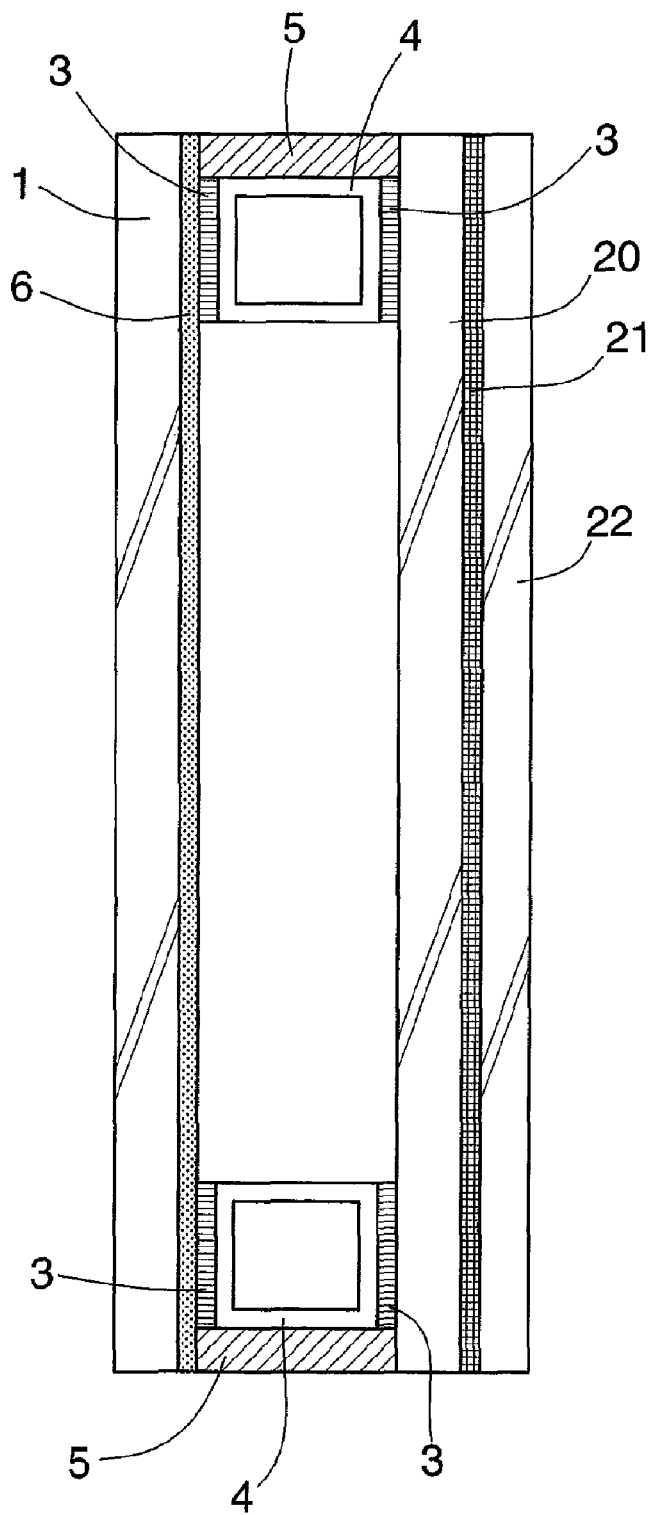
FIG. 4 is a sectional view of an electromagnetic wave absorption board in which two dielectric boards, on which a resistive film is not formed, are stacked with an interlayer film.

The thickness of the dielectric boards 1 and 2 is important for demonstrating electromagnetic wave absorption capacity. Therefore, it is desirable to optimize electromagnetic wave absorption capacity by adjusting the thickness of the dielectric board by stacking the dielectric boards 10 and 12 as in FIG. 3, the dielectric boards 20 and 22 as in FIG. 4, or the dielectric boards 30 and 32 as in FIG. 5.

Stacking of the dielectric boards can be conducted by using an interlayer film 11 or 21 such as polyvinyl butyral, EVA or the like.

As a dielectric to be stacked, it is possible to select at least one dielectric board from glass sheets, such as soda-lime series glass, aluminosilicate series glass and borosilicate series glass, and various plastic boards such as polycarbonate board and acrylic board. For example, a glass sheet and a glass sheet, a glass sheet and a plastic board, or plastic boards are stacked together.

As the resistive film 6, 8 to be formed on the surface of the dielectric board 1, 2, 12, it is possible to use a transparent metal film formed of at least one metal selected from Ag, Au, Cr, Ti, Al, Cu, SUS, Ni, etc., or a multilayer thin film in which the metal film and a metal oxide film, such as $ZnO$, $SnO_2$, $In_2O_3$, $TiO_2$, $Bi_2O_3$, $Ta_2O_3$, $WO_3$, ZnS, etc. have been stacked.

As the multilayer film, it is possible to suitably select and use, for example, a three-layered stacked one, such as ZnO film/Ag film/ZnO film, $TiO_2$ film/Cr film/$SnO_2$ film, ZnO film/Al film/ZnO film, $SnO_2$ film/TiCr film/$SnO_2$ film, etc., five-layered stacked one, such as ZnO film/Ag film/ZnO film/Ag film/ZnO film, ZnO film/Al film/ZnO film/Al film/ZnO film, $SnO_2$ film/Al film/$SnO_2$ film/Al film/$SnO_2$ film, etc., or ITO film and NESA film (tin oxide film).

Means for forming the above-mentioned resistive film 6,8 is not particularly limited. It is possible to select a physical vapor deposition method (sputtering method, vacuum vapor deposition, etc.) or chemical vapor deposition method.

Furthermore, it is optional to bond a transparent resin film, on which a resistive film has been formed, to the dielectric board. As the resistive film upon this, it is possible to use a film that is the same as the resistive film to be formed on a transparent dielectric board such as glass sheet. As the transparent resin film, it is possible to use polyethylene terephthalate (PET) film, polyester film, etc.

Figure 6:
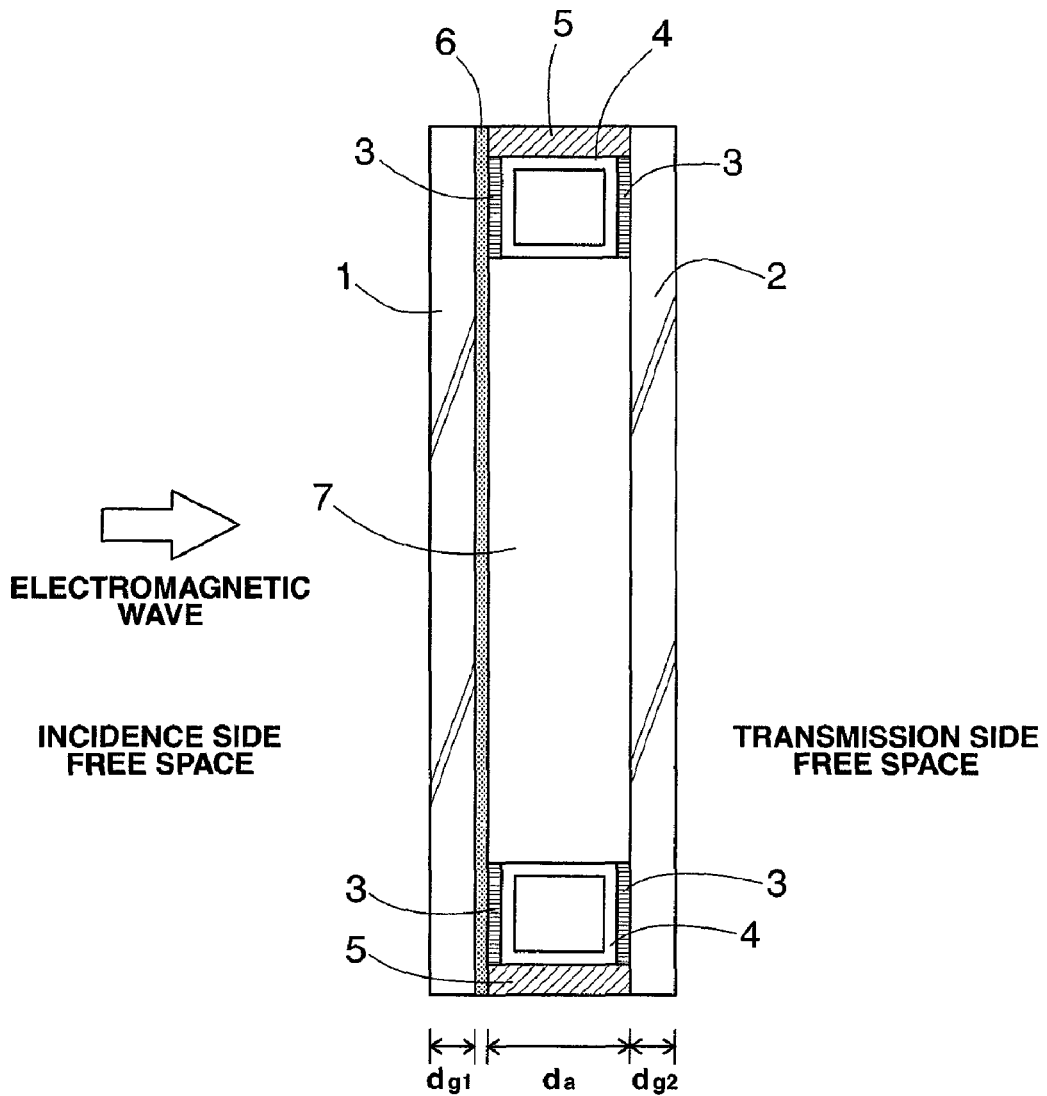
FIG. 6 is a schematic diagram for making an equivalent circuit schematic for calculating impedance, in case that a radio wave comes to a dielectric board on which a resistive film is formed.
Figure 7:
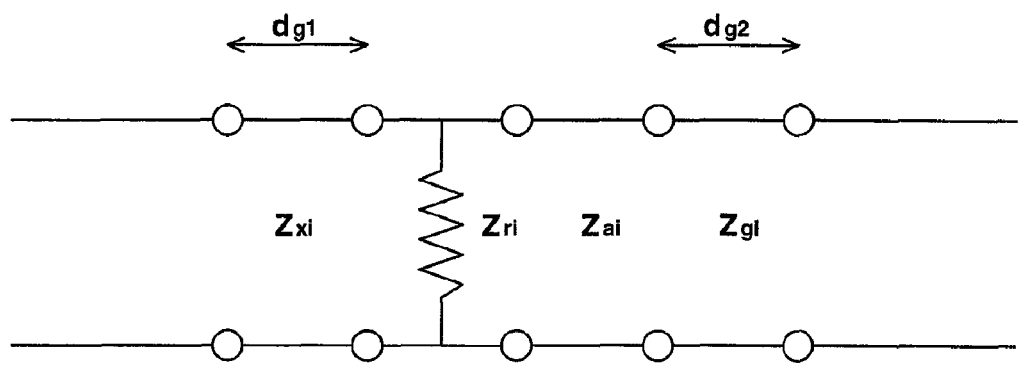
FIG. 7 is an equivalent circuit schematic for calculating impedance in case that the radio wave coming direction is as shown in FIG. 6.
Figure 9:
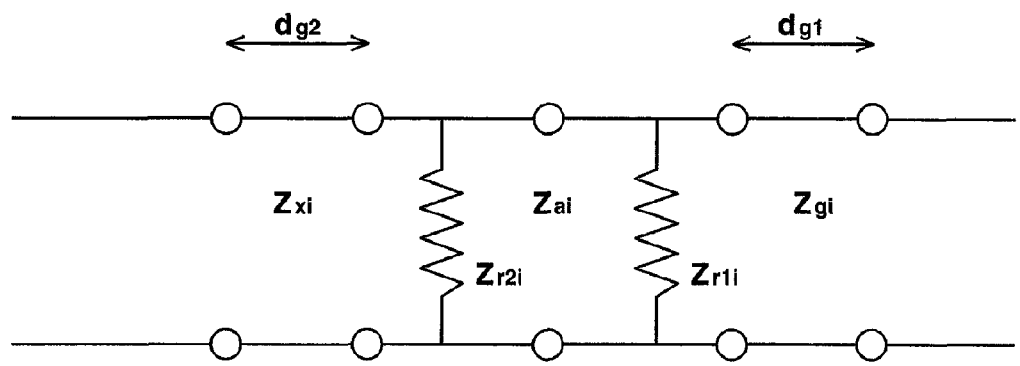
FIG. 9 is an equivalent circuit schematic for calculating impedance in case that the radio wave coming direction is as shown in FIG. 8.

Regarding electromagnetic wave absorption capacity of an electromagnetic wave absorption board of the present invention, there are a case in which electromagnetic waves are incident from the side of the transparent dielectric board 1 on which the resistive film 6 is formed, as shown in FIG. 6, and a case in which electromagnetic waves are incident from the side of the transparent dielectric board 2 on which the resistive film 6 is not formed. Equivalent circuits for determining the amount of absorption of electromagnetic waves are different, as shown in FIG. 7 and FIG. 9, respectively.

Figure 8:
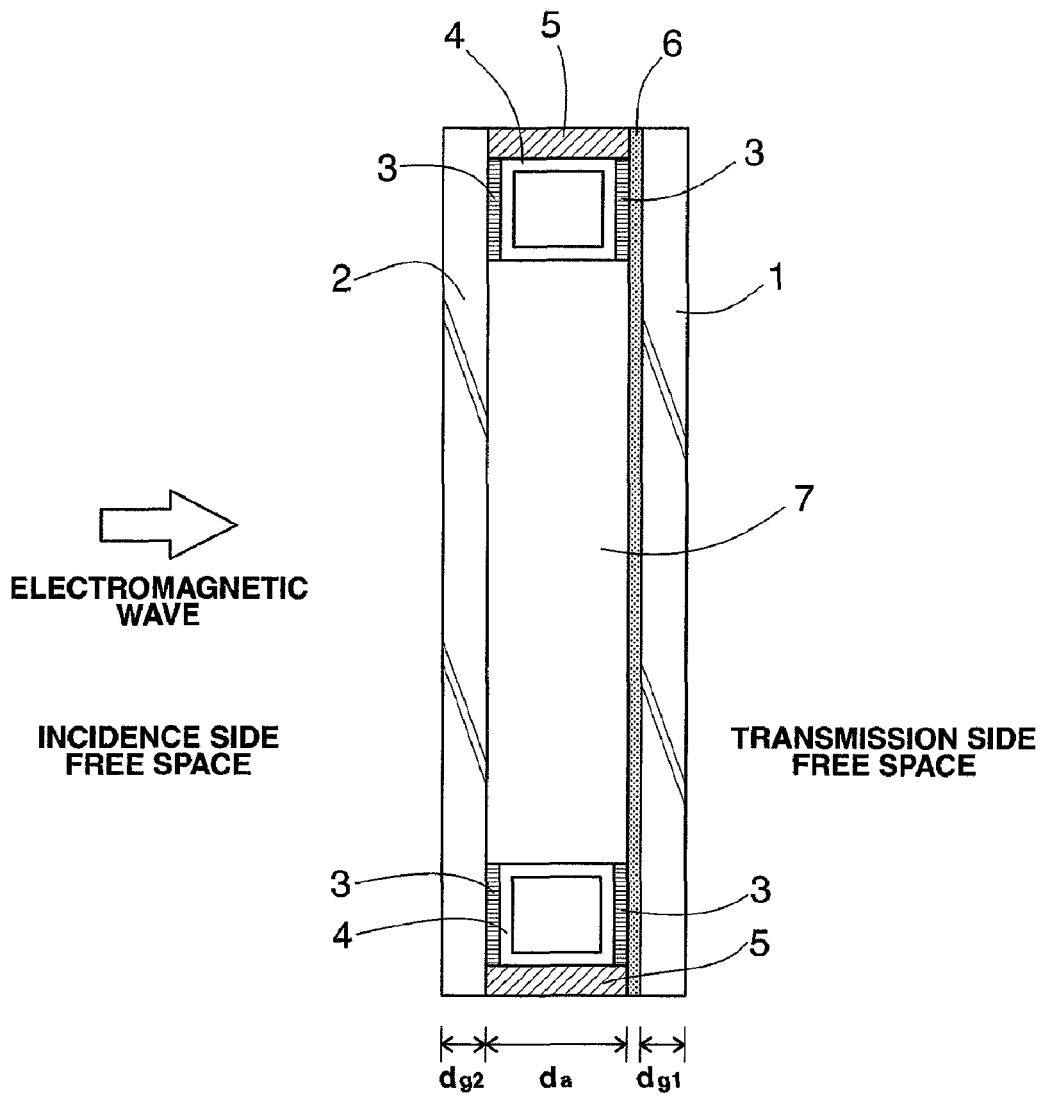
FIG. 8 is a schematic diagram for making an equivalent circuit schematic for calculating impedance, in case that a radio wave comes to a dielectric board on which a resistive film is not formed.

In the following, a case, shown in FIG. 6, in which electromagnetic waves are incident from the side of the transparent dielectric board 1 on which the resistive film 6 is formed, is referred to as Case 1. A case, shown in FIG. 8, in which electromagnetic waves are incident from the side of the transparent dielectric board 2 on which the resistive film 6 is not formed is referred to as Case 2.

Furthermore, as in FIG. 2, a case in which resistive films are formed on both of the surfaces of two dielectric boards facing the hollow layer is referred to as Case 3.

Figure 5:
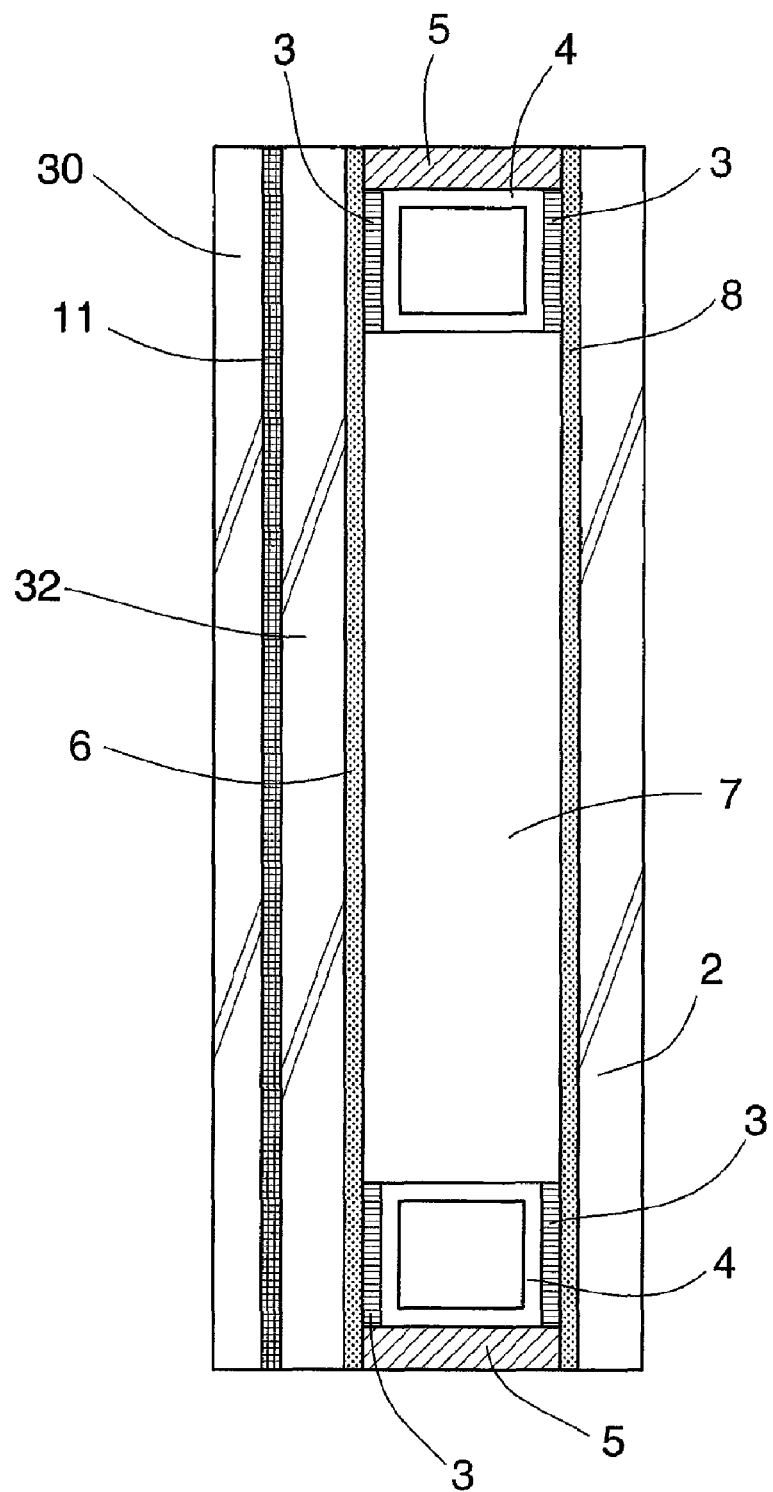
FIG. 5 is a sectional view of an electromagnetic wave absorption board in which resistive films are formed on two surfaces of dielectric boards facing the hollow layer side, and one dielectric board is formed by stacking two dielectric boards.

In the case of Case 1, the amount of absorption of electromagnetic waves is determined as follows. Equivalent circuit in the case of Case 1 is as shown in FIG. 5. In FIG. 5, input impedance $Z_{gi2}$ of the dielectric board 2 on the side of transmission side free space that is opposite to the side on which electromagnetic waves are incident is determined by the following formula (1).

[Numerical Formula 1]

$$Z_{gi2} = \sqrt{\frac{\mu_2}{\varepsilon_2}} \times \frac{1 - Y_2 \times \exp\left(j \times \frac{4\pi}{\lambda i} \times \sqrt{\varepsilon_2 \times \mu_2} \times d_{g2}\right)}{1 + Y_2 \times \exp\left(j \times \frac{4\pi}{\lambda i} \times \sqrt{\varepsilon_2 \times \mu_2} \times d_{g2}\right)} \quad (1)$$

Herein, $\varepsilon_2$ is complex dielectric constant of the transparent dielectric board 2, and $\mu_2$ is relative magnetic permeability of the transparent dielectric board 2. Furthermore, $\gamma_2$ is determined by formula (2), and $j = -1^{1/2}$. $\lambda i$ is wavelength of electromagnetic wave, and $d_{g2}$ is thickness (m) of the transparent dielectric board 2.

[Numerical Formula 2]

$$Y_2 = \frac{\sqrt{\frac{\mu_2}{\varepsilon_2}} - 1}{\sqrt{\frac{\mu_2}{\varepsilon_2}} + 1} \quad (2)$$

Input impedance $Z_{ai}$ to the hollow layer is determined by formula (3).

[Numerical Formula 3]

$$Z_{ai} = \tanh\left[\left(2 \times j \times \frac{\pi}{\lambda_i} \times d_a\right) + a\tanh(Z_{gi2})\right] \quad (3)$$

Herein, $d_a$ is thickness (m) of the hollow layer 7.

Impedance $Z_{ri}$ on the side of the hollow layer 7 of the resistive film formed on the transparent dielectric board 1 is determined by the following formula (4) from equivalent circuit schematic shown in FIG. 7.

[Numerical Formula 4]

$$Z_{ri} = \frac{\frac{Z_r}{377} \times Z_{ai}}{\frac{Z_r}{377} + Z_{ai}} \quad (4)$$

Herein, $Z_r$ is sheet resistivity ($\Omega/\square$) of the resistive film 6, and 377 is characteristic impedance of air.

Input impedance Zxi of electromagnetic waves on the side of the transparent dielectric board 1 (the side of electromagnetic wave incidence) of FIG. 6 is determined by the following formula (5) from equivalent circuit shown in FIG. 7.

[Numerical Formula 5]

$$Z_{xi} = \sqrt{\frac{\mu_1}{\varepsilon_1}} \times \tanh\left[\left(2j \times \frac{\pi}{\lambda_i} \times \sqrt{\varepsilon_1 \times \mu_1} \times d_{g1}\right) + a\tanh\left(\frac{z_{ri}}{\sqrt{\frac{\mu_1}{\varepsilon_1}}}\right)\right] \quad (5)$$

Herein, $\in_1$ is complex dielectric constant of the transparent dielectric board 1, and μ1 is relative magnetic permeability of the transparent dielectric board. In the case of glass sheet, $\in_1$=7−0.1j (j=(−1)$^{1/2}$), and $\mu_1$=1. $\lambda_i$ is wavelength of electromagnetic wave, and $d_{g1}$ is thickness (m) of a transparent platelike body.

Furthermore, reflection coefficient $\Gamma_{i1}$ of an electromagnetic wave reflected from the surface of the transparent dielectric is a value determined by the following formula (6).

[Numerical Formula 6]

$$\Gamma_{i1} = \frac{Z_{xi} - 1}{Z_{xi} + 1} \quad (6)$$

From reflection coefficient $\Gamma_{i1}$, the amount of electromagnetic wave absorption Ai1 can be determined by the following formula (7).

[Numerical Formula 7]

$$A_{i1} = 20 \times \log(|\Gamma_{i1}|) \quad (7)$$

Next, the amount of absorption of electromagnetic wave in the case of Case 2 is determined by using equivalent circuit shown in FIG. 9. In FIG. 9, input impedance $Z_{gi1}$ of the dielectric board 1 on the side of a free space that is opposite to the side on which electromagnetic waves are incident is determined by the following formula (8).

[Numerical Formula 8]

$$Z_{gi1} = \sqrt{\frac{\mu_1}{\varepsilon_1}} \times \frac{1 - \gamma_1 \times \exp\left(j \times \frac{4\pi}{\lambda_i} \times \sqrt{\varepsilon_1 \times \mu_1} \times d_{g1}\right)}{1 + \gamma_1 \times \exp\left(j \times \frac{4\pi}{\lambda_i} \times \sqrt{\varepsilon_1 \times \mu_1} \times d_{g1}\right)} \quad (8)$$

Herein, $\gamma_1$ is determined by the following formula (9).

[Numerical Formula 9]

$$\gamma_1 = \frac{\sqrt{\frac{\mu_1}{\varepsilon_1}} - 1}{\sqrt{\frac{\mu_1}{\varepsilon_1}} + 1} \quad (9)$$

Input impedance of the resistive film 3 formed on the transparent dielectric board 1 is determined by the following formula (10).

[Numerical Formula 10]

$$Z_{ri1} = \frac{\frac{Z_r}{377} \times Z_{ai1}}{\frac{Z_r}{377} + Z_{ai1}} \quad (10)$$

Furthermore, input impedance $Z_{ai2}$ on the surface of the hollow layer 7 is determined by the following formula (11).

[Numerical Formula 11]

$$Z_{ai2} = \tanh\left[\left(2 \times j \times \frac{\pi}{\lambda_i} \times d_a\right) + a\tanh(Z_{gi1})\right] \quad (11)$$

A resistive film of a surface resistivity value $Z_{r i2}$, shown in FIG. 6, on the surface of a transparent dielectric on the side on which electromagnetic waves are incident is hypothesized, and impedance of this resistive film is determined by the following formula from equivalent circuit of FIG. 7.

[Numerical Formula 12]

$$Z_{ri2} = \frac{\frac{Z_{r2}}{377} \times Z_{ai2}}{\frac{Z_{r2}}{377} + Z_{ai2}} \quad (12)$$

Furthermore, impedance of electromagnetic waves incident on the transparent dielectric 1 on the side of electromagnetic wave incidence is determined by the following formula (13).

[Numerical Formula 13]

$$Z_{xi2} = \sqrt{\frac{\mu_2}{\varepsilon_2}} \times \tanh\left[\left(2j \times \frac{\pi}{\lambda_i} \times \sqrt{\varepsilon_2 \times \mu_2} \times d_{g2}\right) + a\tanh\left(\frac{Z_{ri2}}{\sqrt{\frac{\mu_2}{\varepsilon_2}}}\right)\right] \quad (13)$$

Herein, $\in_2$ is complex dielectric constant of the transparent dielectric platelike body, and $\mu_2$ is relative magnetic permeability of the transparent dielectric platelike body. In the case of glass sheet, $\in_2$=7−0.1j (j=(−1)$^{1/2}$), and $\mu_2$=1. $\lambda_i$ is wavelength of electromagnetic wave, and $d_{g2}$ is thickness (m) of a transparent dielectric board.

Reflection coefficient $\Gamma_{i2}$ of an electromagnetic wave reflected from the surface of the transparent dielectric is a value determined by the following formula (14).

[Numerical Formula 14]

$$\Gamma_{i2} = \frac{Z_{xi2} - 1}{Z_{xi2} + 1} \quad (14)$$

From reflection coefficient $\Gamma_{i2}$, electromagnetic wave absorption amount $\lambda_{i2}$ in case that electromagnetic waves are incident from the side of the transparent dielectric board on which a resistive film is not formed can be determined by the following formula (15).

[Numerical Formula 15]

$$A_{i2} = 20 \times \log(|\Gamma_{i2}|) \quad (15)$$

Figure 12:
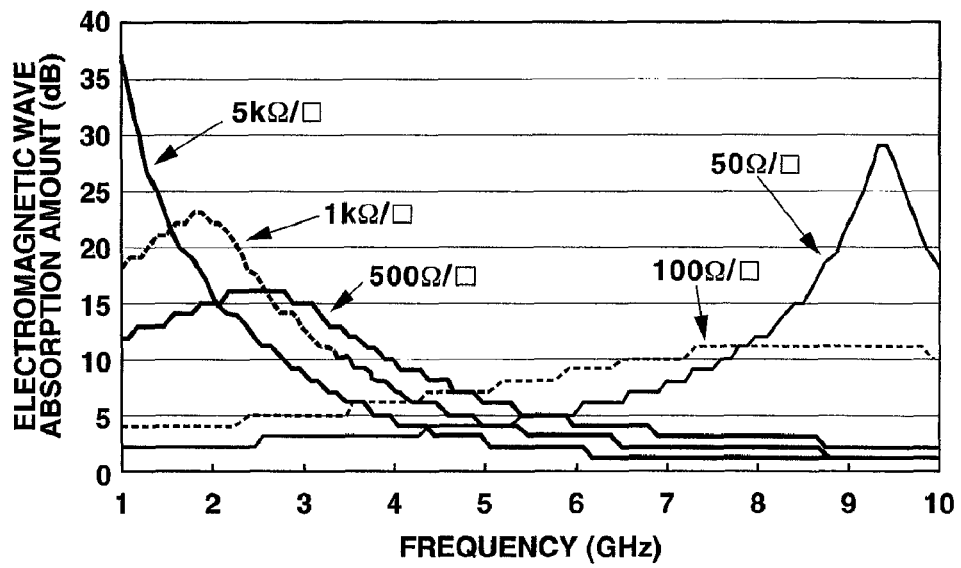
FIG. 12 is a graph showing a relationship between the surface resistance value of the resistive film and the amount of absorption of electromagnetic wave in case that the thickness of each of the two glass sheets is 6 mm and the thickness of the hollow layer 7 is 6 mm in an electromagnetic wave absorption board of FIG. 1.

Regarding the amount of electromagnetic wave absorption upon using glass sheets as the transparent dielectric boards shown in FIG. 1, for example, when a resistive film is formed on a glass sheet having a thickness of 6 mm, when the thickness of the hollow layer 7 is set to 6 mm, and when the thickness of a glass sheet disposed to be opposed to the glass on which the resistive film has been formed is set to 6 mm, a graph of absorption amount relative to wavelength of electromagnetic wave is obtained as shown in FIG. 12 by determining the amount of absorption of electromagnetic wave in the case of Case 1 by formula (7).

When a graph such as FIG. 12 was prepared by setting the glass sheet, on which the resistive film has been formed, to have 6 kinds of thicknesses of 3 mm, 5 mm, 8 mm, 10 mm, 12 mm and 15 mm and by setting the glass sheet, which is opposingly disposed, to have 3 mm, 5 mm, 8 mm, 10 mm, 12 mm and 15 mm, relative to the respective glass sheets on which the resistive films have been formed, and when the range of resistance of the resistive film, in which the amount of absorption to electromagnetic waves of 2.45 GHz and 5.2 GHz became 10 dB or more, was determined, the results shown in Table 1 were obtained in Case 1, and the results shown in Table 2 were obtained in Case 2.

Table 1 was prepared based on the amount of absorption determined by formula (7), and Table 2 was prepared based on the amount of absorption determined by formula (15).

In the preparation of Table 1 and Table 2, the upper limit value of the resistive film was set to 2 k$\Omega$/□, since the amount of absorption determined by formula (7) or formula (15) becomes different from the measured value of the amount of absorption once the resistance value of the resistive film exceeds 2 k$\Omega$/□.

TABLE 1

| Hollow Layer Thickness | Thickness of Glass Sheet with Resistive Film Formed Thereon | Resistance Range Where Amount of Absorption of 2.45 GHZ Electromagnetic Wave Becomes 10 dB or More ($\Omega$/□) | Resistance Range Where Amount of Absorption of 5.2 GHZ Electromagnetic Wave Becomes 10 dB or More ($\Omega$/□) |
|---|---|---|---|
| 6 mm | 3 mm | 100-2k | 100-1k |
| | 5 mm | 100-2k | 20-500 |
| | 8 mm | 100-2k | 500-2k |
| | 10 mm | 20-1k | 200-2k |
| | 12 mm | 20-1k | 200-2k |
| | 15 mm | 40-100 | 20-500 |
| 8 mm | 3 mm | 100-2k | 100-1k |
| | 5 mm | 100-2k | 20-400 |
| | 8 mm | 50-600 | None |
| | 10 mm | 20-500 | None |
| | 12 mm | 20-500 | 200-1k |
| | 15 mm | 20-100 | 20-200 |
| 10 mm | 3 mm | 100-2k | 150-850 |
| | 5 mm | 100-1k | 20-200 |
| | 8 mm | 50-500 | None |
| | 10 mm | 20-500 | None |
| | 12 mm | 20-500 | 100-2k |
| | 15 mm | None | 20-200 |
| 12 mm | 3 mm | 100-2k | None |
| | 5 mm | 100-1k | 20-200 |
| | 8 mm | 50-300 | None |
| | 10 mm | 20-400 | None |
| | 12 mm | 20-400 | 200-2k |
| | 15 mm | 20-100 | 20-200 |

TABLE 2

| Hollow Layer Thickness | Thickness of Glass Sheet with Resistive Film Formed Thereon | Resistance Range Where Amount of Absorption of 2.45 GHZ Electromagnetic Wave Becomes 10 dB or More ($\Omega$/□) | Resistance Range Where Amount of Absorption of 5.2 GHZ Electromagnetic Wave Becomes 10 dB or More ($\Omega$/□) |
|---|---|---|---|
| 6 mm | 3 mm | 20-2k | None |
| | 5 mm | 20-2k | None |
| | 8 mm | 50-1k | None |
| | 10 mm | 150-1k | 200-2k |
| | 12 mm | 200-1k | 100-2k |
| | 15 mm | None | None |
| 8 mm | 3 mm | 50-2k | None |
| | 5 mm | 50-1k | None |
| | 8 mm | None | None |
| | 10 mm | None | 150-2k |
| | 12 mm | None | 100-2k |
| | 15 mm | None | None |
| 10 mm | 3 mm | 50-2k | None |
| | 5 mm | 50-650 | None |
| | 8 mm | None | None |
| | 10 mm | None | 200-2k |

TABLE 2-continued

| Hollow Layer Thickness | Thickness of Glass Sheet with Resistive Film Formed Thereon | Resistance Range Where Amount of Absorption of 2.45 GHZ Electromagnetic Wave Becomes 10 dB or More (Ω/□) | Resistance Range Where Amount of Absorption of 5.2 GHZ Electromagnetic Wave Becomes 10 dB or More (Ω/□) |
|---|---|---|---|
| | 12 mm | None | 100-2k |
| | 15 mm | None | None |
| 12 mm | 3 mm | 100-1k | None |
| | 5 mm | 100-1k | None |
| | 8 mm | None | None |
| | 10 mm | None | 300-2k |
| | 12 mm | None | 100-2k |
| | 15 mm | None | None |

It is understood by comparison between Table 1 and Table 2 that the range of thickness of the glass sheet and the range of thickness of the hollow layer 7, in which the amount of absorption becomes 10 dB or more, in Case 1 are wider than those in Case 2.

It is understood from Table 1 and Table 2 that those, in which the thickness of the glass sheet with a resistive film formed thereon is in a range of 2-20 mm, in which the thickness of the hollow layer is in a range of 5-15 mm, and in which a resistive film of a range of 20-2 kΩ/□ is formed on either glass sheet of a pair of glass sheets, have a capacity of absorbing electromagnetic waves used for wireless LAN by 10 dB or more.

In particular, from Table 1 and Table 2, there are some preferable, in which the amount of electromagnetic wave absorption becomes 10 dB or more to an electromagnetic wave of 2.45 GHz, in both cases of Case 1 and Case 2 or either case of Case 1 and Case 2, in case that resistance range of the resistive film is a range of 20-2 kΩ/□, in case (1) that the thickness of the glass sheet with a resistive film formed thereon is 2 mm or greater and less than 8 mm and that the thickness of the hollow layer 7 is 5 mm-15 mm, and in case (2) that the thickness of the glass sheet with a resistive film formed thereon is 8 mm or greater and less than 1 mm and that the thickness of the hollow layer 7 is 5 mm or greater and less than 8 mm.

Furthermore, from Table 1, there are some preferable, in which the amount of absorption of 2.45 GHz electromagnetic wave becomes 10 dB or more, by adjusting the surface resistivity value of the resistive film to 20-600Ω/□, in case (3) that the thickness of the glass sheet with a resistive film formed thereon is 8 mm to 20 mm and that the thickness of the hollow layer is 8 mm to 15 mm.

Next, from Table 1 and Table 2, there are some preferable, in which the amount of electromagnetic wave absorption becomes 10 dB or more to 5.2 GHz electromagnetic wave, of those (4) in which the hollow layer 7 is in a range of 5-15 mm, in which the thickness of the glass sheet with a resistive film formed thereon is in a range of greater than 8 mm and less than 15 mm, and in which a resistive film of 100Ω/□ to 2 kΩ/□ is formed, in both cases of Case 1 and Case 2 or either case of Case 1 and Case 2.

Furthermore, there are some preferable, in which 5.2 GHz electromagnetic wave is absorbed by 10 dB or more, of those (5) in which the thickness of the hollow layer is in a range of 5 mm-15 mm, in which the thickness of the glass sheet with a resistive film formed thereon is in a range of 2 mm to 8 mm, and in which a resistive film of a surface resistivity value of 20Ω/□ to 2 kΩ/□ is formed.

Furthermore, there are some preferable, in which 5.2 GHz electromagnetic wave is absorbed by 10 dB or more, of those (6) in which the thickness of the hollow layer is in a range of 5 mm-16 mm, in which the thickness of the glass sheet with a resistive film formed thereon is in a range of 15 mm to 20 mm, and in which a resistive film of 20-600Ω/□ is formed.

Furthermore, considering the case in which the amount of absorption becomes 20 dB or more (attenuation to ¹/₁₀₀) with respect to the thickness of the glass sheet with a resistive film formed thereon and the thickness of the hollow layer, the ranges of the surface resistivity value of the resistive film are shown in Table 3 with respect to 2.45 GHz, and the ranges of the surface resistivity of the resistive film are shown in Table 4.

TABLE 3

| Hollow Layer Thickness (mm) | Thickness of Glass Sheet with Resistive Film Formed Thereon (mm) | Resistance Range Where Amount of Absorption of 2.45 GHz Electromagnetic Wave Becomes 20 dB or More (Ω/□) | Resistance Range Where Amount of Absorption of 5.2 GHz Electromagnetic Wave Becomes 20 dB or More (Ω/□) |
|---|---|---|---|
| 6 | 3 | 400-2k | None |
| | 5 | None | 40-100 |
| | 10 | 50-200 | 1k-2k |
| | 12 | 50-200 | 1k-2k |
| | 15 | None | 20-150 |
| 8 | 3 | None | None |
| | 5 | None | None |
| | 10 | None | None |
| | 12 | 20-100 | 1k-2k |
| | 15 | None | 20-100 |
| 10 | 3 | None | None |
| | 5 | None | None |
| | 10 | None | None |
| | 12 | None | 500-2k |
| | 15 | None | None |
| 12 | 3 | None | None |

TABLE 3-continued

| Hollow Layer Thickness (mm) | Thickness of Glass Sheet with Resistive Film Formed Thereon (mm) | Resistance Range Where Amount of Absorption of 2.45 GHz Electromagnetic Wave Becomes 20 dB or More (Ω/□) | Resistance Range Where Amount of Absorption of 5.2 GHz Electromagnetic Wave Becomes 20 dB or More (Ω/□) |
|---|---|---|---|
| | 5 | None | 40-100 |
| | 10 | None | None |
| | 12 | 20-100 | 500-2k |
| | 15 | None | None |

TABLE 4

| Hollow Layer Thickness (mm) | Thickness of Glass Sheet with Resistive Film Formed Thereon (mm) | Resistance Range Where Amount of Absorption of 2.45 GHz Electromagnetic Wave Becomes 20 dB or More (Ω/□) | Resistance Range Where Amount of Absorption of 5.2 GHz Electromagnetic Wave Becomes 20 dB or More (Ω/□) |
|---|---|---|---|
| 6 | 3 | 50-2k | None |
| | 5 | 50-1k | None |
| | 10 | None | None |
| | 12 | None | 500-2k |
| | 15 | None | None |
| 8 | 3 | 200-1k | None |
| | 5 | None | None |
| | 10 | None | None |
| | 12 | None | 500-2k |
| | 15 | None | None |
| 10 | 3 | 100-700 | None |
| | 5 | None | None |
| | 10 | None | None |
| | 12 | None | 500-2k |
| | 15 | None | None |
| 12 | 3 | 200-1k | None |
| | 5 | 200-700 | None |
| | 10 | None | 1k-2k |
| | 12 | None | 1k-2k |
| | 15 | None | None |

Figure 10:
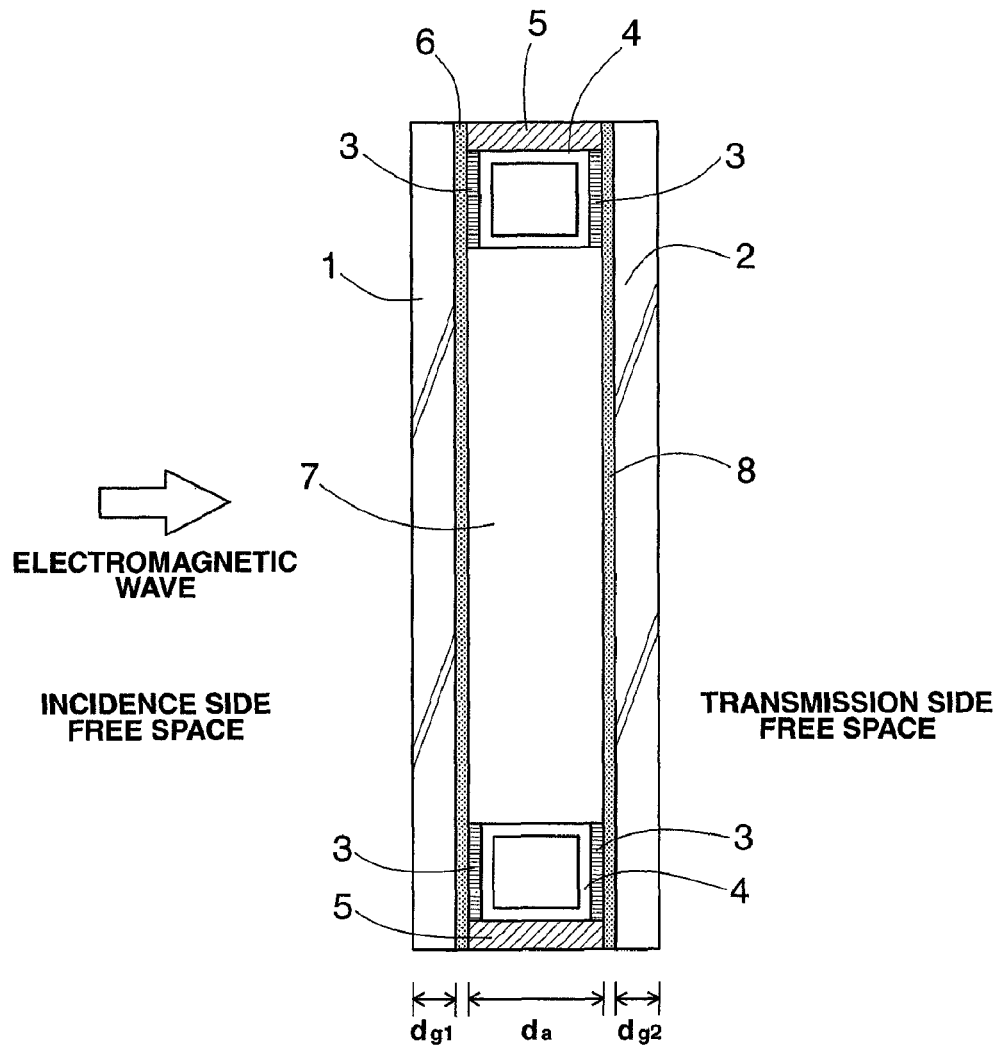
FIG. 10 is a schematic diagram for making an equivalent circuit schematic for calculating impedance of an electromagnetic wave absorption board shown in FIG. 2.
Figure 11:
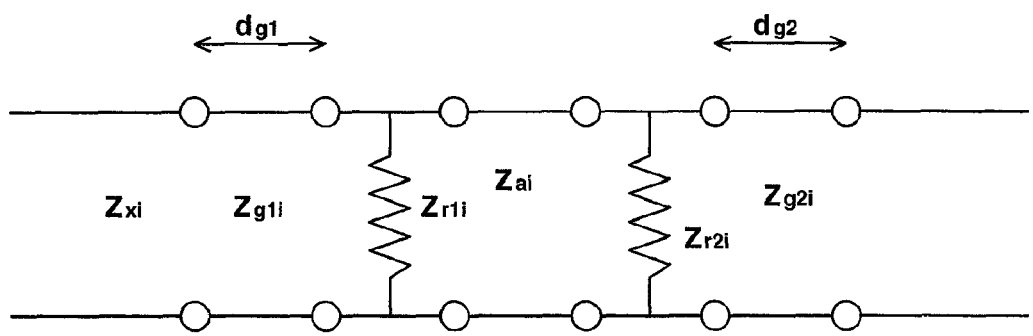
FIG. 11 is an equivalent circuit schematic for calculating impedance in case that the radio wave coming direction is as shown in FIG. 10.

In the case of Case 3, with respect to electromagnetic wave absorption capacity, as shown in FIG. 10, equivalent circuit for determining the amount of electromagnetic wave absorption is as shown in FIG. 11, provided that electromagnetic waves are incident on the side of the transparent glass sheet 1 on which the resistive film 6 is formed.

Firstly, input impedance $Z_{g2i}$ of the glass sheet 2 of the transmission side free space shown in FIG. 10 is determined.

[Numerical Formula 16]

$$Z_{g2i} = \sqrt{\frac{\mu_2}{\varepsilon_2}} \times \frac{1 - \gamma_2 \times \exp\left(j \times \frac{4\pi}{\lambda i} \times \sqrt{\varepsilon_2 \times \mu_2} \times d_{g2}\right)}{1 + \gamma_2 \times \exp\left(j \times \frac{4\pi}{\lambda i} \times \sqrt{\varepsilon_2 \times \mu_2} \times d_{g2}\right)} \quad (16)$$

Herein, $\varepsilon_2$ is complex dielectric constant of the transparent glass sheet 2, and $\mu_2$ is relative magnetic permeability. Furthermore, $\gamma_2$ is determined by formula (17), and $j = -1^{1/2}$. $\lambda_i$ is wavelength of electromagnetic wave, and $d_{g2}$ is thickness (m) of the transparent glass sheet 2.

$\gamma_2$ is determined by the following formula (17).

[Numerical Formula 17]

$$\gamma_2 = \frac{\sqrt{\frac{\mu_2}{\varepsilon_2}} - 1}{\sqrt{\frac{\mu_2}{\varepsilon_2}} + 1} \quad (17)$$

Next, input impedance on the surface of the resistive film 8 is determined.

[Numerical Formula 18]

$$Z_{r2i} = \frac{\frac{Z_{r2}}{377} \times Z_{ai}}{\frac{Z_{r2}}{377} + Z_{ai}} \quad (18)$$

Herein, $Z_{r2}$ is surface resistivity (Ω/□), and 377 is characteristic impedance of air.

Next, input impedance $Z_{ai}$ on the surface of the hollow layer is determined from formula (19).

Herein, $d_a$ is thickness (m) of the hollow layer.

[Numerical Formula 19]

$$Z_{ai} = \tanh\left[\left(2 \times j \times \frac{\pi}{\lambda_i} \times d_a\right) + a\tanh(Z_{g2i})\right] \quad (19)$$

Impedance Zr1i on the resistive film side of the transparent dielectric on the incident electromagnetic wave side shown in FIG. 10 is determined by the following formula (20).

[Numerical Formula 20]

$$Z_{r1i} = \frac{\frac{Z_{r1}}{377} \times Z_{ai}}{\frac{Z_{r1}}{377} + Z_{ai}} \quad (20)$$

Input impedance Zxi on the incidence side of electromagnetic waves of FIG. 10 is a value determined by the following formula (21) from the equivalent circuit shown in FIG. 11.

[Numerical Formula 21]

$$Z_{xi} = \sqrt{\frac{\mu_1}{\varepsilon_1}} \times \tanh\left[\left(2j \times \frac{\pi}{\lambda_i} \times \sqrt{\varepsilon_1 \times \mu_1} \times d_{g1}\right) + a\tanh\left(\frac{Z_{r1i}}{\sqrt{\frac{\mu_1}{\varepsilon_1}}}\right)\right] \quad (21)$$

Herein, $\varepsilon_1$ is complex dielectric constant of the transparent platelike body, and $\mu_1$ is relative magnetic permeability of the transparent platelike body. In the case of glass sheet, $\varepsilon_1 = 7-0.1j$ ($j=(-1)^{1/2}$), and $\mu_1=1$. $\lambda_i$ is wavelength of electromagnetic wave, and $d_{g1}$ is thickness (m) of the transparent platelike body.

Furthermore, reflection coefficient $\Gamma_{i1}$ of an electromagnetic wave reflected from the surface of the transparent platelike body is a value determined by the following formula (22),

[Numerical Formula 22]

$$\Gamma_{i1} = \frac{Z_{xi} - 1}{Z_{xi} + 1} \quad (22)$$

and from reflection coefficient $\Gamma_{i1}$, the amount of electromagnetic wave absorption $A_{i1}$ can be determined by the following formula (23).

[Numerical Formula 23]

$$A_{i1} = 20 \times \log(|\Gamma_{i1}|) \quad (23)$$

Figure 13:
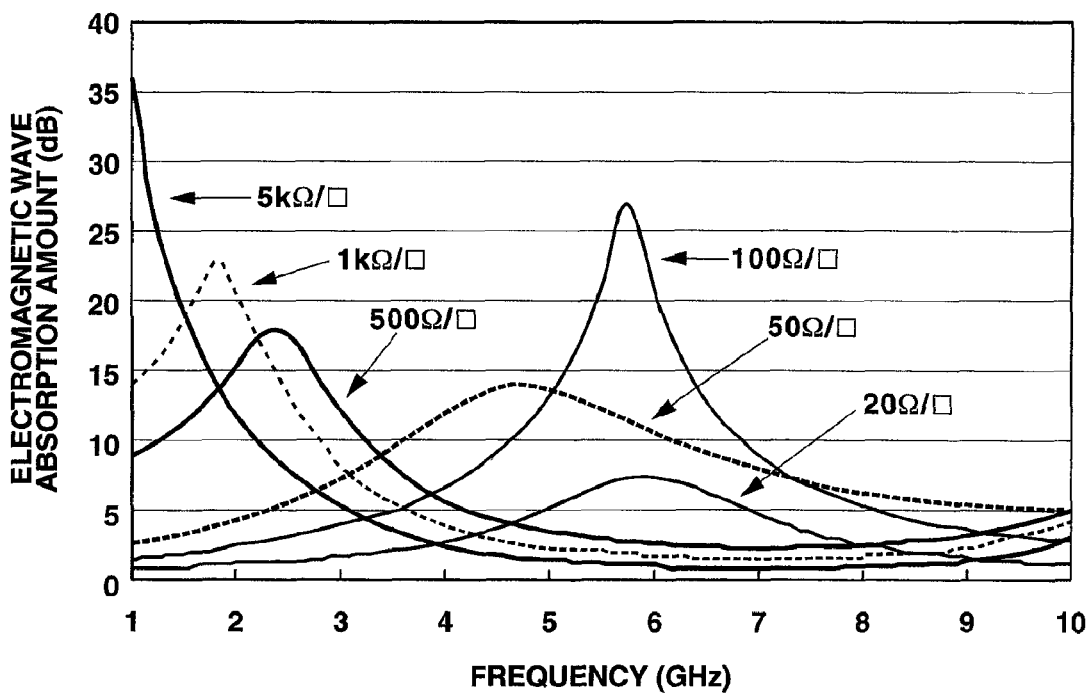
FIG. 13 is a graph showing a relationship between the surface resistance value of the resistive film and the amount of absorption of electromagnetic wave in case that the thickness of each of the two glass sheets is 6 mm and the thickness of the hollow layer 7 is 6 mm in an electromagnetic wave absorption board of FIG. 1.

As the amount of electromagnetic wave absorption upon using glass sheets having a thickness of 6 mm as the transparent dielectric boards 1, 2 shown in FIG. 2 is determined by formula (23) by setting the thickness of the hollow layer 7 to 6 mm and by making identical the resistance values of the resistive films 6, 8 to be formed on the glass sheets 1 and 2, a graph of the amount of absorption relative to electromagnetic wave wavelength is obtained, as shown in FIG. 13.

When a graph such as FIG. 13 was prepared by setting the glass sheet to have 5 kinds of thicknesses of 3 mm, 5 mm, 10 mm, 12 mm and 15 mm and by setting the glass sheet, which is opposingly disposed, to have 3 mm, 5 mm, 10 mm, 12 mm and 15 mm, relative to the respective glass sheets on which the resistive films have been formed, and when the range of resistance of the resistive film, in which the amount of absorption to electromagnetic waves of 2.45 GHz and 5.2 GHz became 10 dB or more, was determined, the results shown in Table 5 were obtained. Furthermore, as a case having an outstanding effect, the resistance ranges of the resistive films, in which absorption capacity becomes 20 dB or more, are shown in Table 6.

With respect to the thickness of the glass sheet, the thickness of the hollow layer 7 and resistance value of the resistive film for providing 10 dB shown in Table 5, the thickness of the two glass sheets is in a range of 3-20 mm, the thickness of the hollow layer 7 is in a range of 5-15 mm, and the resistance value of the resistive film is in a range of 20Ω/□ to 2 kΩ/□.

Furthermore, from Table 5, it is preferable, since the amount of absorption of 2.45 GHz electromagnetic wave becomes 10 dB or more, in case (6) that the hollow layer 7 is in a range of 5-15 mm, the thickness of at least one glass sheet is in a range of 2-6 mm, and the resistance value of the resistive film to be formed on the glass sheet is in a range of 100Ω/□ to 2 kΩ/□, or in case (7) that the hollow layer 7 is in a range of 5-15 mm, the thickness of at least one glass sheet is in a range of greater than 6 mm and not greater than 14 mm, and the resistance value of the resistive film to be formed on the glass sheet is in a range of 20-500Ω/□, or in case (8) that the hollow layer 7 is in a range of 11-13 mm, the thickness of at least one glass sheet is in a range of greater than 14 mm and not greater than 20 mm, and the resistance value of the resistive film to be formed on the glass sheet is in a range of 20-150Ω/□.

Furthermore, it is preferable, since the amount of absorption of 5.2 GHz electromagnetic wave becomes 10 dB or more, in case (9) that the hollow layer 7 is 5-11 mm, the thickness of at least one glass sheet is in a range of 2-9 mm, and the resistance value of the resistive film to be formed on the glass sheet is in a range of 20-500Ω/□, or in case (10) that the hollow layer 7 is 7-13 mm, the thickness of at least one glass sheet is in a range of 11-20 mm, and the resistance value of the resistive film is in a range of 20Ω/□ to 2 kΩ/□,

TABLE 5

| Hollow Layer Thickness (mm) | Thickness of Glass Sheet with Resistive Film Formed Thereon (mm) | Resistance Range Where Amount of Absorption of 2.45 GHz Electromagnetic Wave Becomes 10 dB or More (Ω/□) | Resistance Range Where Amount of Absorption of 5.2 GHz Electromagnetic Wave Becomes 10 dB or More (Ω/□) |
|---|---|---|---|
| 6 | 3 | 200-2k | 100-500 |
|  | 5 | 100-2k | 20-500 |
|  | 10 | 20-700 | None |

TABLE 5-continued

| Hollow Layer Thickness (mm) | Thickness of Glass Sheet with Resistive Film Formed Thereon (mm) | Resistance Range Where Amount of Absorption of 2.45 GHz Electromagnetic Wave Becomes 10 dB or More ($\Omega/\square$) | Resistance Range Where Amount of Absorption of 5.2 GHz Electromagnetic Wave Becomes 10 dB or More ($\Omega/\square$) |
| --- | --- | --- | --- |
|  | 12 | 20-1k | None |
|  | 15 | None | None |
| 8 | 3 | 200-2k | None |
|  | 5 | 100-1k | 20-200 |
|  | 10 | 20-500 | None |
|  | 12 | 20-500 | 100-2k |
|  | 15 | None | 20-700 |
| 10 | 3 | 200-2k | None |
|  | 5 | 100-2k | 20-200 |
|  | 10 | 20-500 | None |
|  | 12 | 20-500 | 200-2k |
|  | 15 | None | None |
| 12 | 3 | 100-2k | None |
|  | 5 | 100-1k | None |
|  | 10 | 20-500 | None |
|  | 12 | 20-500 | None |
|  | 15 | 20-150 | 20-200 |

TABLE 6

| Hollow Layer Thickness (mm) | Thickness of Glass Sheet with Resistive Film Formed Thereon (mm) | Resistance Range Where Amount of Absorption of 2.45 GHz Electromagnetic Wave Becomes 20 dB or More ($\Omega/\square$) | Resistance Range Where Amount of Absorption of 5.2 GHz Electromagnetic Wave Becomes 20 dB or More ($\Omega/\square$) |
| --- | --- | --- | --- |
| 6 | 3 | 700-2k | None |
|  | 5 | 500-2k | 20-50 |
|  | 10 | 50-500 | None |
|  | 12 | 50-500 | None |
|  | 15 | None | None |
| 8 | 3 | 500-2k | None |
|  | 5 | 500-1k | 20-200 |
|  | 10 | 20-100 | None |
|  | 12 | 20-100 | 700-2k |
|  | 15 | None | None |
| 10 | 3 | 500-2k | None |
|  | 5 | None | None |
|  | 10 | 20-100 | None |
|  | 12 | 20-100 | 700-2k |
|  | 15 | None | None |
| 12 | 3 | None | None |
|  | 5 | 20-200 | None |
|  | 10 | None | None |
|  | 12 | 20-100 | None |
|  | 15 | None | None |

EXAMPLE 1

As an electromagnetic absorption board of a structure shown in FIG. 1, Samples 1-4 were prepared, which were different in thickness of the glass sheet, thickness of the hollow layer 7 and surface resistivity value of the resistive film, as shown in Table 7, by using float-produced glass sheets for the dielectrics 1, 2. The hollow layer 7 was filled with air. As the spacer, there was used a spacer having a hollow rectangular sectional shape and made of aluminum. The distance of the hollow layer was changed by the size of the spacer.

Samples 1-4 are electromagnetic wave absorption boards prepared to be used for 2.45 GHz frequency band of wireless LAN in the case of Case 1.

As the resistive film, one prepared by forming $TiO_2$ film, Cr film and $SnO_2$ film in this order by sputtering method was used. Surface resistivity of the resistive film was adjusted by the film thickness.

Figure 14:
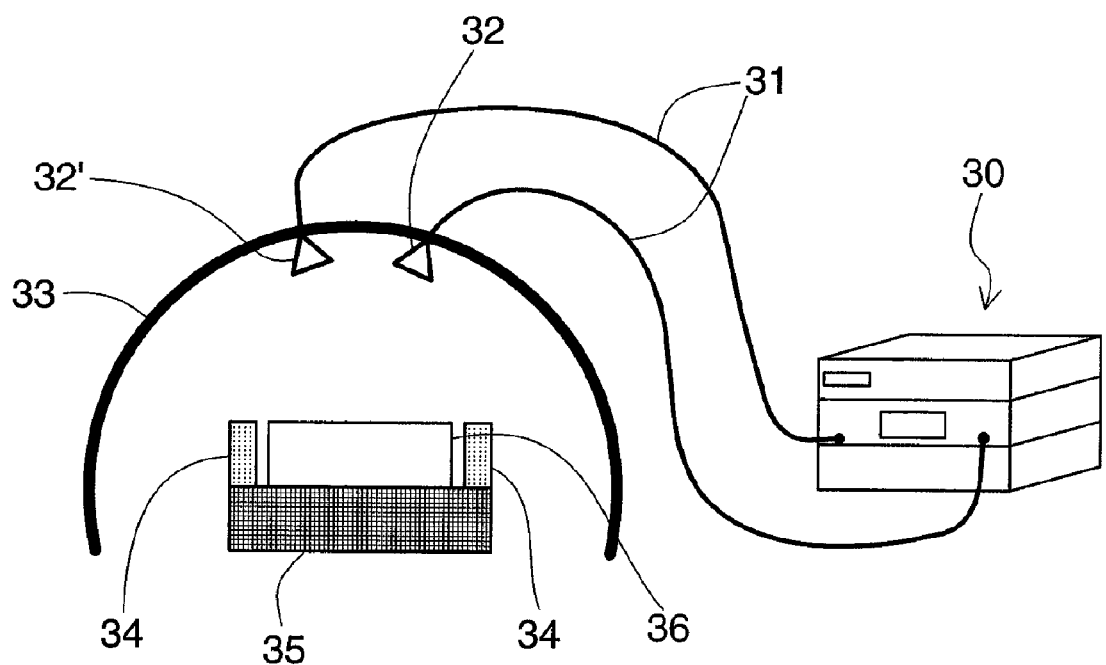
FIG. 14 is a schematic diagram showing an apparatus for measuring electromagnetic wave absorption capacity.

Electromagnetic wave absorption capability of the electromagnetic wave absorption boards (Samples 1-4) prepared was measured by an arch-type measurement apparatus shown in FIG. 14 and using a time-domain method.

In the measurement, an electromagnetic wave is transmitted by using a network analyzer 30 from a transmitting antenna 32 placed in an arch-type frame 33, and the amount of reflection of an electromagnetic wave reflected from the electromagnetic wave absorption board (Samples 1-4) is measured by a receiving antenna 32' with the network analyzer. Horn antennas were used for both of the transmitting antenna 32 and the receiving antenna 32'. The reference numeral 31 represents electrical wires.

With respect to the electromagnetic wave absorption board (Samples 1-4) 36, the amount of reflection of a metal board made by aluminum was measured, and then the amount of reflection of the electromagnetic wave absorption board (Samples 1-4) was measured. The difference between the amount of reflection of the metal board and the amount of reflection of the electromagnetic wave absorption board (Samples 1-4) was calculated as the amount of electromagnetic wave absorption of Samples 1-4.

In the measurement of the amount of reflection of the electromagnetic wave absorption board (Samples 1-4) 36, the measurement was conducted by placing Samples 1-4 on the sample base 35 made of an electromagnetic wave absorbing, foamed polyurethane and by surrounding the circumference with an electromagnetic wave absorbing body 34 formed by kneading carbon.

The measured amounts of absorption of electromagnetic wave are shown in Table 7. In Table 7, the amounts of absorption of electromagnetic wave determined by calculation are also shown. The amounts of absorption of electromagnetic wave determined by calculation and the measured amounts of absorption of electromagnetic wave well coincided with each other, as shown in Table 7.

TABLE 7

|  |  | Sample 1 | Sample 2 | Sample 3 | Sample 4 |
| --- | --- | --- | --- | --- | --- |
| Structure of Electromagnetic Wave Absorption Board | Thickness of Glass Sheet With Resistive Film (mm) | 12 | 12 | 12 | 12 |
|  | Thickness of Glass Sheet Opposingly Disposed (mm) | 5 | 5 | 5 | 5 |
|  | Thickness of Air Layer (mm) | 6 | 12 | 6 | 12 |
| Surface Resistivity | Value of Resistive Film ($\Omega/\square$) | 57 | 57 | 30 | 30 |
| Amount of Electromagnetic Wave Absorption | (Calculated Value dB) | 24 | 30 | 10 | 10 |
|  | (Measured Value dB) | 24 | 30 | 10 | 10 |

In the measurement, TE wave (in the case that electrical field is normal to incidence plane) and TM wave (in the case that magnetic field is normal to incidence plane) were measured, but there was no noticeable difference.

Not only normal incidence, but also the measurement in the case of oblique incidence of being 45 degrees inclined from normal was conducted. By its comparison with the measured results of normal incidence, there was no noticeable difference.

Boxes were prepared by using the electromagnetic wave absorption boards of Samples 1-4, and a notebook-size personal computer was put into the box. The box was prepared in a manner to orient the resistive film side to the inside.

A wireless LAN connection was tried in a frequency band of frequency 2.45 GHz from the notebook-size personal computer installed in the box to a server installed outside of the box, but the connection was not possible, and it was confirmed that electromagnetic waves from the server were not transmitted into the inside of the box. Therefore, it was possible to confirm that the electromagnetic wave absorption boards of Samples 1-4 had electromagnetic wave absorption capacities at practical level.

EXAMPLE 2

Similar to Example 1, electromagnetic wave absorption boards (Samples 5-8) shown in Table 8 were prepared to be used in 5.2 GHz frequency band of wireless LAN in the case of Case 1. Furthermore, similar to Example 1, the amount of absorption of electromagnetic wave was measured.

In Table 8, the amounts of absorption of electromagnetic wave determined by calculation and the measured amounts of electromagnetic wave are shown, both values well coincided.

TABLE 8

|  |  | Sample 5 | Sample 6 | Sample 7 | Sample 8 |
|---|---|---|---|---|---|
| Structure of Electromagnetic Wave Absorption Board | Thickness of Glass Sheet With Resistive Film (mm) | 6 | 6 | 6 | 6 |
|  | Thickness of Glass Sheet Opposingly Disposed (mm) | 3 | 3 | 3 | 3 |
|  | Thickness of Air Layer (mm) | 6 | 12 | 6 | 12 |
| Surface Resistivity Value of Resistive Film (Ω/□) | | 57 | 57 | 30 | 30 |
| Amount of Electromagnetic Wave Absorption | (Calculated Value dB) | 20 | 21 | 10 | 10 |
|  | (Measured Value dB) | 20 | 21 | 10 | 15 |

EXAMPLE 3

Electromagnetic wave absorption boards (Samples 9-11) shown in Table 9 were prepared to be used in 2.45 GHz frequency band of wireless LAN in the case of Case 2 by repeating Example 1 except in that a resistive film was prepared by forming $ZnO_2$ film, Al film and $ZnO_2$ film in this order by sputtering method.

Similar to Example 1, the amount of absorption of electromagnetic wave was measured. In Table 9, the amounts of absorption of electromagnetic wave determined by calculation and the measured amounts of absorption of electromagnetic wave are shown, and both values well coincided.

TABLE 9

|  |  | Sample 9 | Sample 10 | Sample 11 |
|---|---|---|---|---|
| Structure of Electromagnetic Wave Absorption Board | Thickness of Glass Sheet Opposingly Disposed (mm) | 12 | 6 | 10 |
|  | Thickness of Glass Sheet With Resistive Film (mm) | 6 | 4 | 6 |
|  | Thickness of Air Layer (mm) | 6 | 12 | 12 |
| Surface Resistivity Value of Resistive Film (Ω/□) | | 100 | 240 | 120 |
| Amount of Electromagnetic Wave Absorption | (Calculated Value dB) | 30 | 30 | 10 |
|  | (Measured Value dB) | 30 | 30 | 10 |

EXAMPLE 4

Electromagnetic wave absorption boards (Samples 12-14) shown in Table 10 were prepared to be used in 2.45 GHz frequency band of wireless LAN in the case of Case 2 by repeating Example 1 except in that a resistive film was prepared by forming $ZnO_2$ film, Al film and $ZnO_2$ film in this order by sputtering method.

Similar to Example 1, the amount of absorption of electromagnetic wave was measured. In Table 10, the amounts of absorption of electromagnetic wave determined by calculation and the measured amounts of absorption of electromagnetic wave are shown, and both values well coincided.

TABLE 10

|  |  | Sample 12 | Sample 13 | Sample 14 |
|---|---|---|---|---|
| Structure of Electromagnetic Wave Absorption Board | Thickness of Glass Sheet Opposingly Disposed (mm) | 12 | 10 | 12 |
|  | Thickness of Glass Sheet With Resistive Film (mm) | 12 | 10 | 10 |
|  | Thickness of Air Layer (mm) | 6 | 12 | 6 |
| Surface Resistivity Value of Resistive Film (Ω/□) | | 620 | 1500 | 520 |
| Amount of Electromagnetic Wave Absorption | (Calculated Value dB) | 20 | 20 | 10 |
|  | (Measured Value dB) | 20 | 20 | 10 |

EXAMPLE 5

Electromagnetic wave absorption boards of Samples 15-18 shown in Table 11 were prepared, as electromagnetic wave absorption boards of Case 3, to be used in 2.45 GHz frequency band of wireless LAN. All of Samples 15-18 had a structure shown in FIG. 2. Transparent glass sheets 1, 2 were prepared by using glass sheets (soda-lime series glass) of 1 m×1 m produced by float method.

As the spacer 4, there was used a spacer having a hollow rectangular section and made of aluminum. The thickness of the hollow layer 7 was changed by the sectional size of the spacer.

As the resistive film 6, 8, one prepared by forming $TiO_2$ film, Cr film and $SnO_2$ film in this order by sputtering method was used. Surface resistivity of the resistive film was adjusted by the film thickness. Resistive films having the same resistance value were formed on the glass sheets 1, 2.

TABLE 11

| | | Sample 15 | Sample 16 | Sample 17 | Sample 18 |
|---|---|---|---|---|---|
| Structure of Electromagnetic Wave Absorption Board | Thickness of Dielectric Board 1 (mm) | 3 | 12 | 10 | 5 |
| | Thickness of Dielectric Board 2 (mm) | 3 | 12 | 10 | 5 |
| | Thickness of Air Layer (mm) | 6 | 12 | 6 | 12 |
| Surface Resistivity | Value of Resistive Film (Ω/□) | 1300 | 50 | 50 | 500 |
| Amount of Electromagnetic Wave Absorption | (Calculated Value dB) | 23 | 20 | 10 | 10 |
| | (Measured Value dB) | 23 | 20 | 10 | 10 |

With respect to electromagnetic wave absorption capability of the electromagnetic wave absorption boards prepared, the amount of absorption of electromagnetic wave was measured in the same manner as that of Example 1 by an arch-type measurement apparatus shown in FIG. 14 and using a time-domain method.

Boxes were prepared by using the electromagnetic wave absorption boards of Samples 15-18, and a notebook-size personal computer was put into the box.

A wireless LAN connection was tried in a frequency band of frequency 2.45 GHz from the notebook-size personal computer installed in the box to a server installed outside of the box, but the connection was not possible, and it was confirmed that electromagnetic waves from the server were not transmitted into the inside of the box. Therefore, it was possible to confirm that the electromagnetic wave absorption boards of Samples 15-18 had electromagnetic wave absorption capacities at practical level.

EXAMPLE 6

Similar to Example 5, electromagnetic wave absorption boards (Samples 19-22) shown in Table 12 were prepared to be used in 5.2 GHz frequency band of wireless LAN.

TABLE 12

| | | Sample 19 | Sample 20 | Sample 21 | Sample 22 |
|---|---|---|---|---|---|
| Structure of Electromagnetic Wave Absorption Board | Thickness of Dielectric Board 1 (mm) | 5 | 6 | 3 | 5 |
| | Thickness of Dielectric Board 2 (mm) | 5 | 6 | 3 | 5 |
| | Thickness of Air Layer (mm) | 6 | 12 | 6 | 12 |
| Surface Resistivity | Value of Resistive Film (Ω/□) | 60 | 50 | 150 | 100 |
| Amount of Electromagnetic Wave Absorption | (Calculated Value dB) | 24 | 20 | 10 | 10 |
| | (Measured Value dB) | 24 | 20 | 10 | 10 |

Similar to Example 1, the amount of absorption of electromagnetic wave was measured. In Table 12, the amounts of absorption of electromagnetic wave determined by calculation and the measured amounts of absorption of electromagnetic wave are shown. Both values well coincided.

The invention claimed is:

1. An electromagnetic absorption panel for absorbing electromagnetic waves of a wireless local area network, wherein:

first and second transparent glass sheets are arranged at an interval by having a spacer at a circumferential end portion thereof so that a hollow layer sealed between the first and second glass sheets is formed;

each of the first and second glass sheets has a thickness in a range from 2.5 to 20 mm, and the hollow layer has a thickness in a range from 2.5 to 15 mm;

at least one glass sheet of the first and second glass sheets is formed with a resistive film on a surface thereof on a side facing the hollow layer, said resistive film having a surface resistance in a range from 20Ω/□ to 2 kΩ/□; and the resistive film is prepared by forming in the following order a dielectric film, a metal film, and a further dielectric film on the at least one glass sheet.

2. An electromagnetic absorption panel according to claim 1, wherein the metal film is made of Cr or Al.

* * * * *